United States Patent [19]
Onda

[11] Patent Number: 5,767,539
[45] Date of Patent: Jun. 16, 1998

[54] HETEROJUNCTION FIELD EFFECT TRANSISTOR HAVING A INALAS SCHOTTKY BARRIER LAYER FORMED UPON AN N-INP DONOR LAYER

[75] Inventor: Kazuhiko Onda, Tokyo, Japan

[73] Assignee: NEC Corporation, Tokyo, Japan

[21] Appl. No.: 826,026

[22] Filed: Mar. 28, 1997

[30] Foreign Application Priority Data

Apr. 5, 1996 [JP] Japan ............... 8-110079

[51] Int. Cl.$^6$ ............... H01L 31/0304
[52] U.S. Cl. ............... 257/194; 257/192; 257/200; 257/12
[58] Field of Search ............... 257/183, 192, 257/194, 200, 201, 485, 12

[56] References Cited

U.S. PATENT DOCUMENTS

| | | | |
|---|---|---|---|
| 5,319,223 | 6/1994 | Fujita et al. | 257/194 |
| 5,436,470 | 7/1995 | Nakajima | 257/194 |
| 5,466,955 | 11/1995 | Maruhashi et al. | 257/194 |
| 5,677,553 | 10/1997 | Yamamoto et al. | 257/194 |

OTHER PUBLICATIONS

Greenberg et al., "A Recessed-Gate InAlAs/n+-InP HFET withan InP Etch-Stop Layer." IEEE Electron Device Letters, vol. 13, No. 3, Mar. 1992, pp. 137-139 Mar. 1992.

"Report of IEICE ED 95-105, pp. 13-20".
"IEEE Electron Device Letters, vol. 13, No. 6, pp. 325-327, 1992".
"IEEE Electron Device Letters, vol. 10, No. 3, pp. 114-116, 1989".
"IEEE Microwave and Guided Wave Letters, vol. 1, No. 5, pp. 114-116, 1991".
"IEEE Electron Device Letters, vol. 16, No. 9, pp. 396-398, 1995".
"IEEE Transactions on Electron Devices, vol. 39, No. 9, pp. 2007-2014, 1992".

Primary Examiner—David B. Hardy
Attorney, Agent, or Firm—Laff, Whitesel, Conte & Saret, Ltd.

[57] ABSTRACT

A field effect transistor includes an undoped semiconductor layer formed on a semi-insulating InP substrate and lattice-matched with at least the semi-insulating InP substrate, a channel layer formed on the undoped semiconductor layer and consisting of a semiconductor layer having a larger electron affinity than that of the undoped semiconductor layer, a donor supply layer formed on the channel layer and consisting of an impurity-doped semiconductor layer having a smaller electron affinity than that of the channel layer, and a Schottky gate formation layer consisting of an undoped semiconductor layer formed on the donor supply layer. The donor supply layer consists of impurity-doped InP, and the Schottky gate formation layer consists of InAlAs.

12 Claims, 5 Drawing Sheets

HETEROJUNCTION FIELD EFFECT TRANSISTOR HAVING A INALAS SCHOTTKY BARRIER LAYER FORMED UPON AN N-INP DONOR LAYER

BACKGROUND OF THE INVENTION

1. Field of the Invention

The present invention relates to a reliable and high-performance compound electronic device which operates in the microwave or millimeter wave region and, more particularly, to a field effect transistor.

2. Description of the Prior Art

In recent years, ternary or quaternary mixed crystal semiconductors such as InGaAs and InGaAsP have received a great deal of attention. Of these materials, InGaAs lattice-matched with an InP substrate is promising as a material not only for optical devices but also for various field effect transistors. Particularly, an extensive study has been made for field effect transistors using the two-dimensional electron gas at the heterointerface with InP or InAlAs.

InGaAs is favorable as an electron transport device for the following reasons in comparison to GaAs or the like: (1) the peak drift velocity of electrons is large, (2) the mobility of electrons in a low electric field is large, (3) an ohmic contact can be easily obtained, and the contact resistance is low, (4) a larger overshoot of the electron velocity can be expected, (5) noise caused by valley scattering is small, and (6) the interface characteristic to an insulating material is rather excellent. One of large advantages is that the above-described two-dimensional electron gas device can be realized.

Today, field effect transistors using the two-dimensional electron gas at the InGaAs/InAlAs interface are hopeful as high-performance microwave/millimeter wave devices and have been researched and developed at a number of institutions. Especially, the effectiveness of such transistors as low-noise devices has been confirmed at the experimental level. As reported by K. H. Duh et al. in e.g., reference (1), "IEEE MICROWAVE AND GUIDED WAVE LETTERS, VOL. 1, NO. 5, PP. 114–116, 1991", a noise index of 1.2 dB and an associated gain of 7.2 dB are confirmed at 94 GHz and at room temperature.

In this experiment, devices are formed of a lattice-matched system on an InP substrate, i.e., a material system in which the In composition is defined such as $In_{0.53}Ga_{0.47}As/In_{0.52}Al_{0.48}As$. In this system, a two-dimensional electron gas is generated in the $In_{0.53}Ga_{0.47}As$ layer.

To further improve the characteristics, attempts have been made to set the In composition of the InGaAs layer portion serving as a channel layer to be larger than 0.53 to improve the device characteristics, as reported by G. I. NG et al. in reference (2), "IEEE ELECTRON DEVICE LETTERS, VOL. 10, NO. 3, PP. 114–116, 1989". However, an InP substrate and InGaAs having an In composition of 0.53 or more have lattice misfit. Due to this, the thickness obtainable by crystal growth is limited by the In composition ratio, so the thickness of the InGaAs channel layer is limited.

A device for forming a two-dimensional electron gas layer having a high confinement effect by inserting a thin InAs layer in the InGaAs channel has been reported by T. Akazaki et al. in reference (3), "IEEE ELECTRON DEVICE LETTERS, VOL. 13, NO. 6, PP. 325–327, 1992".

In recent years, for an InAlAs/InGaAs-based heterojunction field effect transistor formed on an InP substrate, various high device characteristics have been reported. On the other hand, a thermal instability factor has been reported; an impurity such as fluorine, i.e., a material other than the constituent materials of the device is mixed into the epitaxial layer and passivates the donor in the impurity-doped InAlAs layer which is generally used as a donor layer.

For example, Hayafuji et al., have reported device degradation due to fluorine in reference (4), "Applied Physics Letters, Vol. 66, No. 7, PP. 863–865, 1995), and Takahashi et al. have examined device degradation due to oxygen in reference (5), "Proc. 7th Int. Conf. InP and Related Materials, pp. 597–600, 1995".

In addition, Fujihara et al. have pointed out in reference (6), "Report of IEICE ED 95–105, pp. 13–20" that impurity mixing can be minimized by lowering the Al composition in the InAlAs Schottky layer formed on the InAlAs donor layer. More specifically, when an InAlAs layer is used as the donor layer, the thermal instability can be removed by forming, on the donor layer, a barrier layer for suppressing impurity mixing. Actually, in this report, when undoped InAlGaAs was used for the Schottky layer, and a heat storage experiment was performed for crystal samples obtained by changing the Al and Ga compositions, the mixing amount of fluorine was reduced as the Al composition was lowered, and accordingly, the reduction amount of sheet electron density was also minimized.

As described above, when InAlAs is used for the donor layer, passivation of the donor ascribed to impurity mixing largely degrades the reliability of the device, resulting in a serious problem.

FIG. 1 is a sectional view showing the structure of a conventional field effect transistor using InAlAs for the donor layer. The field effect transistor comprises an undoped InAlAs semiconductor layer 42 formed on a semi-insulating InP substrate 41 and lattice-matched with the semi-insulating InP substrate 41, a channel layer 43 formed on the i-InAlAs semiconductor layer 42 and consisting of an InGaAs semiconductor layer having a larger electron affinity than that of the undoped semiconductor layer 42, an n-InGaAs layer 45 as a donor supply layer formed on the channel layer 43 and consisting of an impurity-doped semiconductor layer having a smaller electron affinity than that of the channel layer, and a Schottky gate formation layer consisting of an i-InAlAs layer 46 as an undoped semiconductor layer formed on the donor supply layer 45. A source electrode 48b and a drain electrode 48c are formed on an impurity-doped n-InGaAs layer 47. A gate electrode 48a is formed on the i-InAlAs layer 46, i.e., the Schottky gate formation layer.

Generally, a heterojunction field effect transistor formed on an InP substrate often uses an InAlAs layer as the donor supply layer. However, Kusters et al. have proposed a device which uses not InAlAs but InP as a material for the donor layer in reference (7), "IEEE ELECTRON DEVICE LETTERS, VOL. 16, NO. 9, PP. 396–398, 1995". In such a structure, passivation of the donor attributed to mixing of an impurity such as fluorine is prevented by not using InAlAs for the donor layer, thereby obtaining thermal reliability.

As has been indicated in the description of the prior art, in the InAlAs/InGaAs-based heterojunction transistor, impurities represented by fluorine in the air or fluorine adhering to the surface of the sample during the process of heat storage mix into the epitaxial layer to passivate the donor in the InAlAs layer doped with an n-type impurity, resulting in deterioration in reliability.

As a technique of providing a reliable and high-performance InAlAs/InGaAs-based heterojunction transistor, a material suitable as a barrier for suppressing impurity mixing is inserted between the InAlAs layer as the donor layer and the device surface, or a material other than InAlAs is used for the donor layer.

The structure used by Fujihara et al. belongs to the former category. With this structure, however, the distance from the donor layer to the gate increases due to insertion of the barrier layer, and the short-channel effect readily occurs in manufacturing a device having a small gate length.

The structure used by Kusters et al. belongs to the latter category. Since both the Schottky gate formation layer and the donor supply layer are formed of InP, the Schottky barrier height is insufficient, so no sufficient gate dielectric strength is obtained.

SUMMARY OF THE INVENTION

The present invention has been made in consideration of the above situation of the prior art, and has as its object to provide a field effect transistor which avoids thermal instability owing to passivation of a donor upon impurity mixing and can be suitably used for a reliable and high-performance microwave/millimeter wave compound device.

In order to achieve the above object, according to the first basic aspect of the present invention, there is provided a field effect transistor comprising:

an undoped semiconductor layer formed on a semi-insulating InP substrate and lattice-matched with the semi-insulating InP substrate, a channel layer formed on the undoped semiconductor layer and consisting of a semiconductor layer having a larger electron affinity than that of the undoped semiconductor layer, a donor supply layer formed on the channel layer and consisting of an impurity-doped semiconductor layer having a smaller electron affinity than that of the channel layer, and a Schottky gate formation layer consisting of an undoped semiconductor layer formed on the donor supply layer, wherein the donor supply layer consists of impurity-doped InP, and the Schottky gate formation layer consists of InAlAs.

According to the second basic aspect of the present invention, there is provided a field effect transistor comprising an undoped semiconductor layer formed on a semi-insulating InP substrate and lattice-matched with at least the semi-insulating InP substrate, a first donor supply layer consisting of an impurity-doped semiconductor layer formed on the undoped semiconductor layer, a channel layer formed on the first donor supply layer and consisting of a semiconductor layer having a larger electron affinity than that of the first donor supply layer, a second donor supply layer formed on the channel layer and consisting of an impurity-doped semiconductor layer having a smaller electron affinity than that of the channel layer, and a Schottky gate formation layer consisting of an undoped semiconductor layer formed on the second donor supply layer, wherein the second donor supply layer consists of impurity-doped InP, and the Schottky gate formation layer consists of InAlAs.

In addition, according to the present invention, the channel layer of one of the first and second basic aspects comprises (1) an undoped semiconductor layer including at least an InGaAs semiconductor layer, (2) a stacked structure consisting of at least one undoped semiconductor layer including an InGaAs semiconductor layer, (3) an undoped semiconductor layer including at least an InGaAsP semiconductor layer, or (4) a stacked structure consisting of at least one undoped semiconductor layer including at least an InGaAsP semiconductor layer.

Furthermore, according to the present invention, a spacer layer consisting of undoped InP can be formed between the channel layer and the donor layer of one of the first and second basic aspects.

As is apparent from each of the above aspects, according to the present invention, the thermal instability of the device which the device suffers when an impurity such as fluorine is mixed into the donor layer to passivate the donor can be suppressed, and a reliable compound field effect transistor formed on the InP substrate can be realized. The practical value of this device is very large.

The above and many other objects, features and advantages of the present invention will become manifest to those skilled in the art upon making reference to the following detailed description and accompanying drawings in which preferred embodiments incorporating the principles of the present invention are shown by way of illustrative example.

DETAILED DESCRIPTION OF THE PREFERRED EMBODIMENTS

Figure 2:
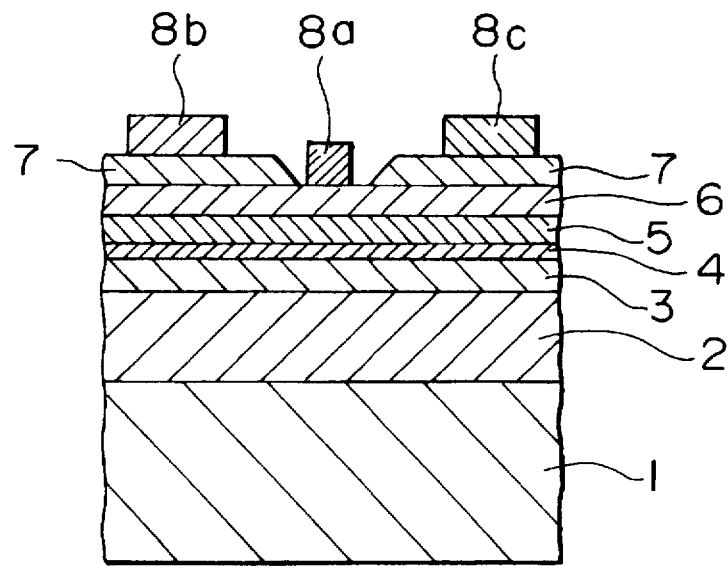
FIG. 2 is a sectional view showing the structure of the first embodiment of the present invention.

Preferred embodiments of the present invention will be described below with reference to the accompanying drawings. Referring to FIG. 2, the first embodiment of the present invention has a structure comprising an undoped semiconductor layer (i-InAlAs layer) 2 formed on a semi-insulating InP substrate 1 and lattice-matched with the semi-insulating InP substrate 1, a channel layer 3 formed on the undoped semiconductor layer 2 and consisting of an undoped InGaAs semiconductor layer having a larger electron affinity than that of the undoped semiconductor layer 2, an undoped InAlAs layer 4, a donor supply layer 5 consisting of an impurity-doped InP layer (n-InP layer) having a smaller electron affinity than that of the channel layer 3, and a Schottky gate formation layer consisting of an undoped semiconductor layer (i-InAlAs) formed on the donor supply layer 5. A gate electrode 8a is formed on an InAlAs layer 6 having a Schottky barrier higher than that of InP.

In the present invention, an n-type impurity-doped InP layer is used as the donor layer, in place of the n-type impurity doped InAlAs layer which is easily contaminated by an unintented impurity such as fluorine. With this structure, passivation of the donor experienced in the heat storage process of the conventional device using the InAlAs donor layer (FIG. 1) is avoided. The gate electrode is formed on the undoped InAlAs layer having a higher Schottky barrier than that of InP. The gate dielectric strength can be ensured by forming the gate electrode on the InAlAs layer, although InP is used for the donor layer.

Figure 4:
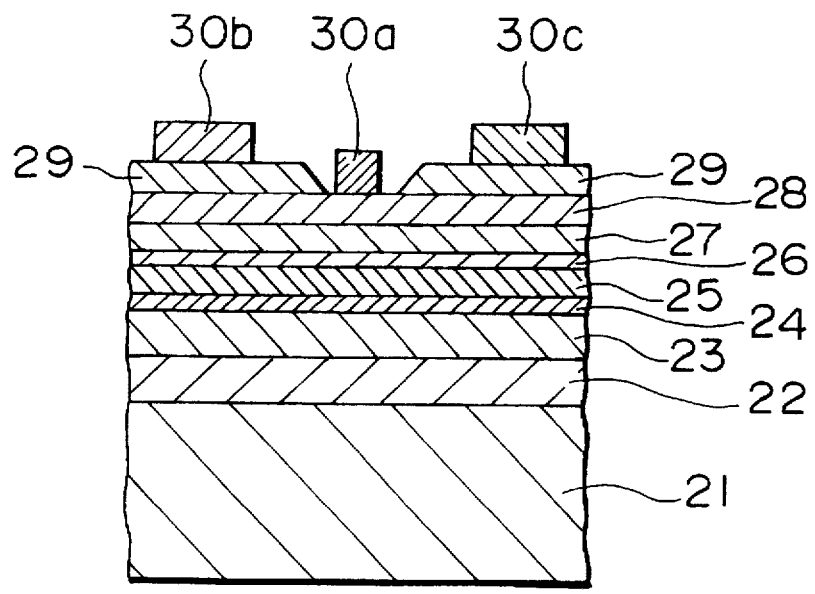
FIG. 4 is a sectional view showing the structure of the third embodiment of the present invention.

As shown in FIG. 4, another embodiment of the present invention comprises an undoped semiconductor layer (i-InAlAs layer) 22 formed on a semi-insulating InP substrate 21 and lattice-matched with the semi-insulating InP substrate 21, a first donor supply layer 23 consisting of an impurity-doped semiconductor layer (n-InAlAs layer) formed on the undoped semiconductor layer 22, a spacer layer 24 consisting of an undoped InAlAs layer formed on the first donor supply layer 23, a channel layer 25 consisting of a semiconductor layer (i-InGaAs layer) having a larger electron affinity than that of the first donor supply layer, a spacer layer 26 consisting of an undoped InP layer, a second donor supply layer 27 consisting of an impurity-doped semiconductor layer (n-InP layer) having a smaller electron affinity than that of the channel layer, and a Schottky gate formation layer consisting of an undoped semiconductor layer (i-InAlAs layer) 28 formed on the second donor supply layer.

The embodiments of the present invention will be described below in more detail.

FIG. 2 is a sectional view for explaining the semiconductor device according to the first embodiment of the present invention.

In the epitaxial structure of the device manufactured in the first embodiment, an undoped InAlAs layer 2 having a thickness of 500 nm, an undoped InGaAs layer 3 having a thickness of 20 nm, an undoped InAlAs layer 4 having a thickness of 5 nm, an InP layer 5 having a thickness of 150 nm and doped with silicon at a concentration of $3\times10^{18}$ cm$^{-3}$, an undoped InAlAs layer 6 having a thickness of 20 nm, and an InGaAs layer 7 having a thickness of 20 nm and doped with silicon at a concentration of $3\times10^{18}$ cm$^{-3}$ are formed on a semi-insulating InP substrate 1 in this order.

Ohmic electrodes 8b and 8c consisting of AuGe, Ni, and Au are formed on the uppermost InGaAs layer 7. The alloy layer is made to reach the undoped InGaAs layer 3 corresponding to the channel by a heat treatment.

A gate electrode 8a is formed in a recess formed between the ohmic electrodes 8b and 8c to contact the undoped InAlAs layer 6. A gate electrode having a gate length of 1 μm is formed by stacking Ti, Pt, and Au in this order. The device is covered with an SiN film (not shown) which is deposited by, e.g., plasma CVD.

As the initial characteristics of the device, a mutual conductance of 400 mS/mm was obtained. In addition, a Schottky barrier height of 0.6 eV and a gate reverse breakdown voltage of 7 V were obtained.

Figure 3:
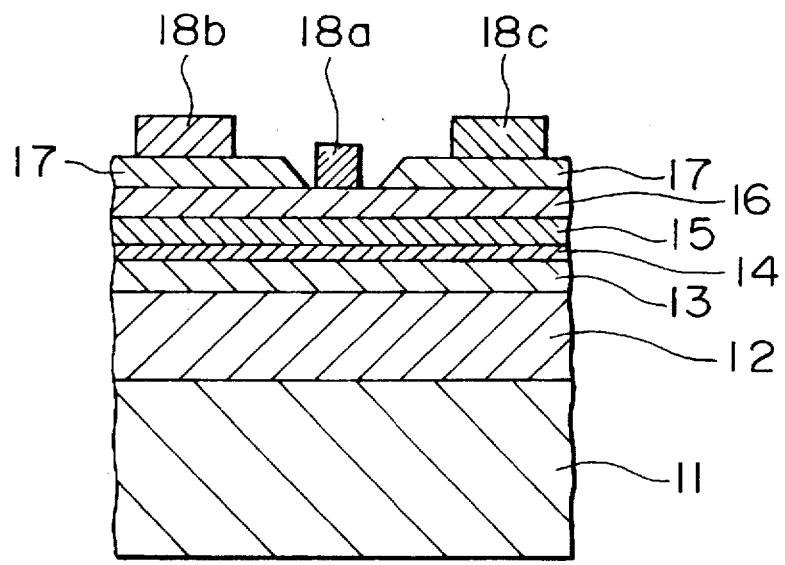
FIG. 3 is a sectional view showing the structure of the second embodiment of the present invention.

As a comparison to the structure of the first embodiment, FIG. 3 shows the second embodiment of the present invention in which an undoped InP layer 14 is used in place of the undoped InAlAs layer 4.

In the second embodiment, a mutual conductance of 390 mS/mm was obtained as the initial characteristics of the device. In addition, a Schottky barrier height of 0.6 eV and a gate reverse breakdown voltage of 7 V were obtained.

FIG. 4 is a sectional view for explaining the semiconductor device according to the third embodiment of the present invention. In the epitaxial structure of the device manufactured in the third embodiment, an undoped InAlAs layer 22 having a thickness of 500 nm, an InAlAs layer 23 having a thickness of 10 nm and doped with silicon at a concentration of $1\times10^{18}$ cm$^{-3}$, an undoped InAlAs layer 24 having a thickness of 5 nm, an undoped InGaAs layer 25 having a thickness of 20 nm, an undoped InP layer 26 having a thickness of 5 nm, an InP layer 27 having a thickness of 150 nm and doped with silicon at a concentration of $3\times10^{18}$ cm$^{-3}$, an undoped InAlAs layer 28 having a thickness of 30 nm, and an InGaAs layer 29 having a thickness of 20 nm and doped with silicon at $3\times10^{18}$ cm$^{-3}$ are stacked on a semi-insulating InP substrate 21 in this order.

Ohmic electrodes 30b and 30c consisting of AuGe, Ni, and Au are formed on the uppermost InGaAs layer 29. The alloy layer is made to reach the undoped InGaAs layer 25 corresponding to the channel by a heat treatment.

A gate electrode 30a is formed in a recess formed between the ohmic electrodes 30b and 30c to contact the undoped InAlAs layer 28. A gate electrode having a gate length of 1 μm is formed by stacking Ti, Pt, and Au in this order. As the device characteristics, a mutual conductance of 350 mS/mm was obtained. In addition, a Schottky barrier height of 0.6 eV and a gate reverse breakdown voltage of 10 V were obtained.

Figure 5:
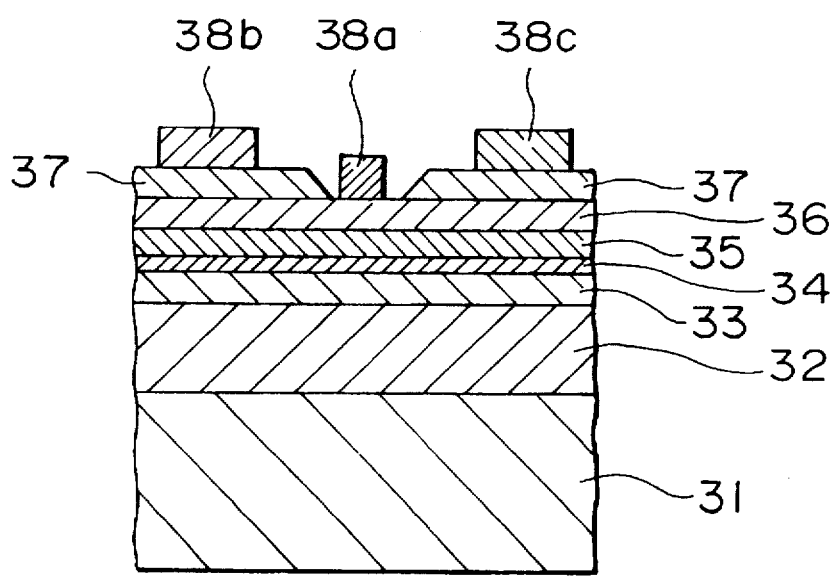
FIG. 5 is a sectional view showing the structure of the fourth embodiment of the present invention.

FIG. 5 is a sectional view for explaining a semiconductor device according to the fourth embodiment of the present invention. In the epitaxial structure of the device manufactured in the fourth embodiment, an undoped InAlAs layer 32 having a thickness of 500 nm, an undoped InGaAsP layer 33 having a thickness of 20 nm, an undoped InP layer 34 having a thickness of 5 nm, an InP layer 35 having a thickness of 150 nm and doped with silicon at $3\times10^{18}$ cm$^{-3}$, an undoped InAlAs layer 36 having a thickness of 20 nm, and an InGaAs layer 37 having a thickness of 20 nm and doped with silicon at $3\times10^{18}$ cm$^{-3}$ are stacked on a semi-insulating InP substrate 31 in this order.

The In and As compositions of the undoped InGaAsP layer 33 serving as a channel are 22% and 49%, respectively.

Ohmic electrodes 38b and 38c consisting of AuGe, Ni, and Au are formed on the uppermost InGaAs layer 37. The alloy layer is made to reach the undoped InGaAsP layer 33 corresponding to the channel by a heat treatment.

A gate electrode 38a is formed in a recess formed between the ohmic electrodes 38b and 38c to contact the undoped InAlAs layer 36. A gate electrode having a gate length of 1 μm is formed by stacking Ti, Pt, and Au in this order.

The device is covered with an SiN film (not shown) which is deposited by, e.g., plasma CVD. As the initial characteristics of the device, a mutual conductance of 250 mS/mm was obtained. In addition, a Schottky barrier height of 0.6 eV and a gate reverse breakdown voltage of about 9 V were obtained.

Figure 1:
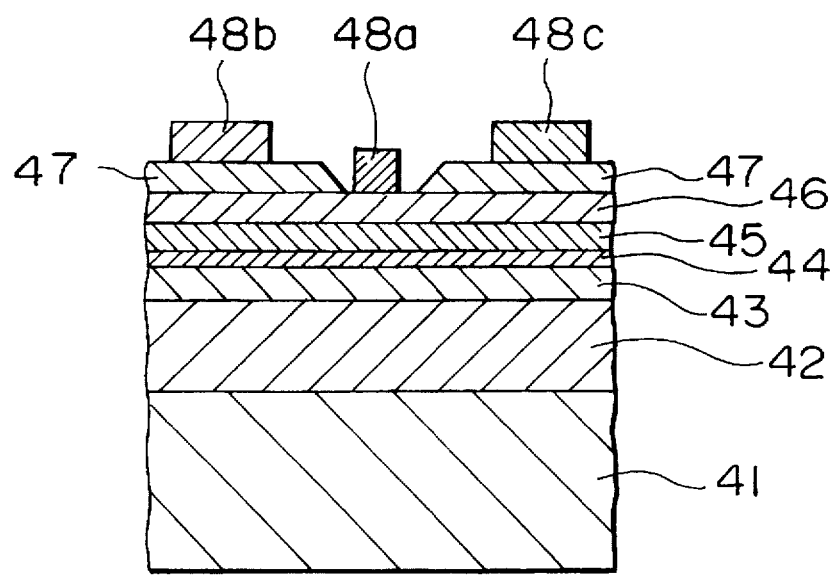
FIG. 1 is a sectional view showing the structure of a conventional field effect transistor.
Figure 6:
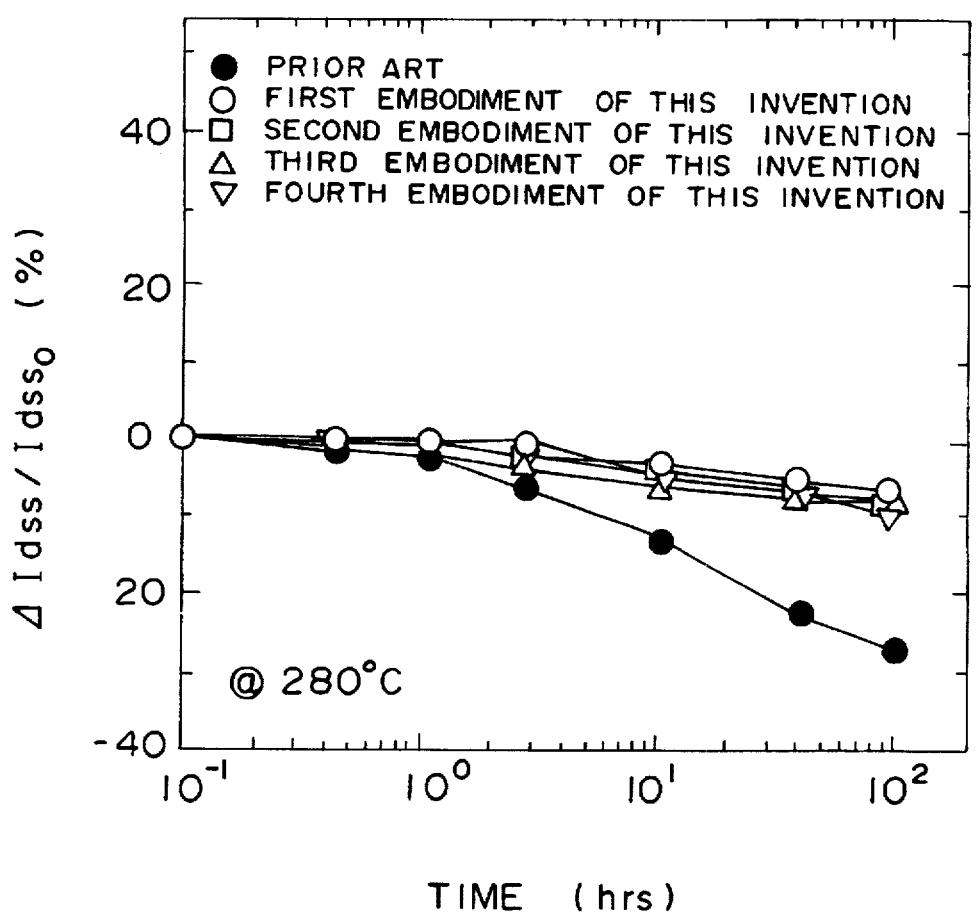
FIG. 6 is a graph showing changes in drain currents with time in the heat storage experiment which was performed for the first to fourth embodiments shown in FIGS. 2 to 5 and the prior art shown in FIG. 1.
Figure 7:
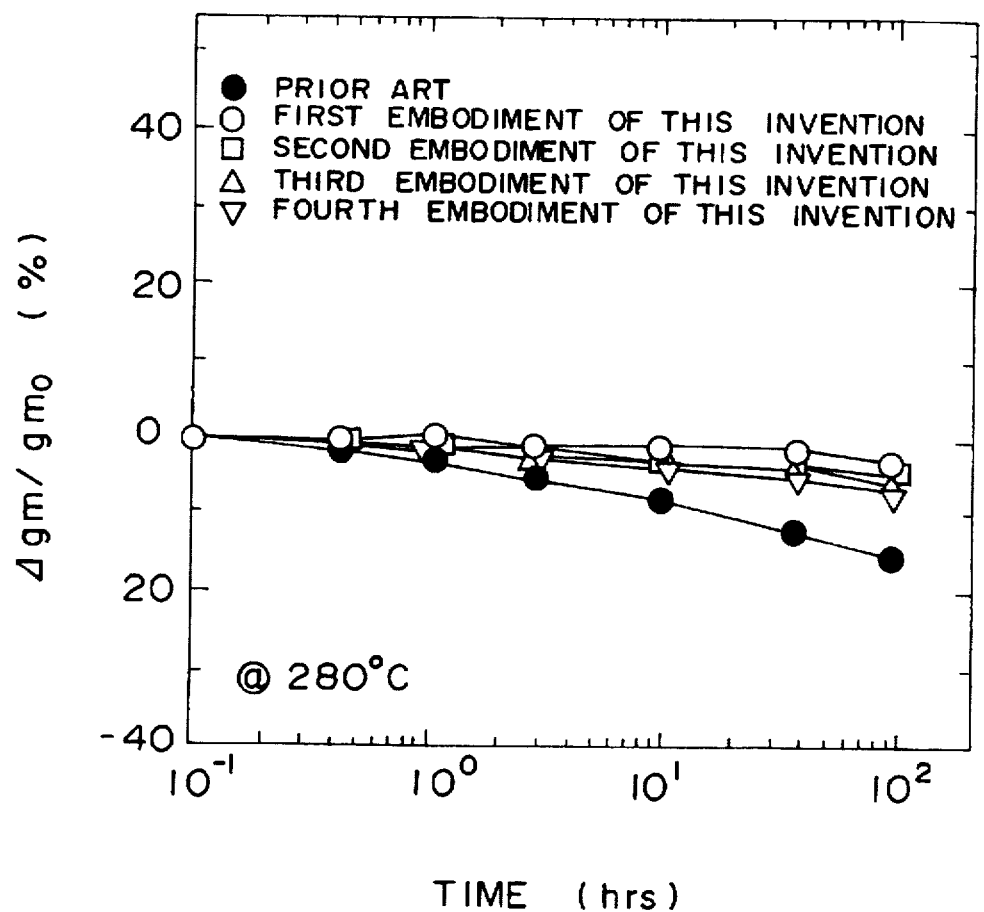
FIG. 7 is a graph showing changes in mutual conductances with time in the heat storage experiment which was performed for the first to fourth embodiments shown in FIGS. 2 to 5 and the prior art shown in FIG. 1.

FIGS. 6 and 7 are graphs showing variations in drain currents Idss and mutual conductances gm with time which were observed when a heat test was performed using a storage furnace at 300° C. for field effect transistors having the structures of the first to fourth embodiments and a field effect transistor having the conventional structure using the InAlAs donor layer as shown in FIG. 1 as a comparative example.

In the conventional structure, the drain current Idss or mutual conductance gm gradually degraded with the elapse of storage time. After 100 hours, the drain current exhibited a decrease of 25% or more the initial value (see the conventional structure indicated by full circles and solid lines in FIG. 6), and the mutual conductance exhibited a degradation of 15% or more the initial value (see the conventional structure indicated by full circles and solid lines in FIG. 7).

On the other hand, as shown in FIG. 6, in the above-mentioned first to fourth embodiments of the present invention (see embodiments 1 to 4 in FIG. 6), the drain current exhibited a change of 10% or less even after 100 hours. As shown in FIG. 7, the mutual conductance gm also exhibited a change of 8% or less, so that excellent thermal stability was obtained. In addition, impurity mixing was checked by performing SIMS analysis for devices after a heat storage test of 100 hours. Mixing of an impurity other than the device constituent materials was not observed. Furthermore, no variations in profiles were observed.

In each of the first to fourth embodiments, specific materials and values have been described. However, this is only for the purpose of better understanding and must not be construed to limit the present invention.

For example, the thickness of each layer or concentration of the doping species in the crystal structure need hot be the value described in the above embodiments. In addition, planar doping of, e.g., Si in the InAlAs layer as the donor layer is still effective in the present invention.

In each of the above embodiments, silicon is used as a donor impurity. However, the donor impurity is not limited to silicon, and any other material such as sulfur or selenium can be used as far as it is capable of n-type doping.

As the ohmic electrode, an alloy electrode consisting of Au, Ge, and Ni is used. However, a nonalloy-type ohmic electrode consisting of, e.g., Ti, Pt, and Au can also be used. The material of the gate metal is not limited to the stacked structure of Ti/Pt/Au. A single layer or stack of various metals represented by WSi, W, Ti/Al, Pt/Ti/Pt/Au, Al, and Mo/Ti/Pt/Au can be used.

As has been described above, the present invention is not limited to the above embodiments, and various changes and modifications can be made on the basis of the principle of the present invention.

What is claimed is:

1. A field effect transistor comprising:

an undoped semiconductor layer formed on a semi-insulating InP substrate and lattice-matched with at least said semi-insulating InP substrate;

a channel layer formed on said undoped semiconductor layer and consisting of a semiconductor layer having a larger electron affinity than that of said undoped semiconductor layer;

a donor supply layer formed on said channel layer and consisting of an impurity-doped semiconductor layer having a smaller electron affinity than that of said channel layer; and a Schottky gate formation layer consisting of an undoped semiconductor layer formed on said donor supply layer, wherein said donor supply layer consists of impurity-doped InP, and said Schottky gate formation layer consists of InAlAs.

2. A field effect transistor comprising:

an undoped semiconductor layer formed on a semi-insulating InP substrate and lattice-matched with at least said semi-insulating InP substrate;

a first donor supply layer consisting of an impurity-doped semiconductor layer formed on said undoped semiconductor layer;

a channel layer formed on said first donor supply layer and consisting of a semiconductor layer having a larger electron affinity than that of said first donor supply layer;

a second donor supply layer formed on said channel layer and consisting of an impurity-doped semiconductor layer having a smaller electron affinity than that of said channel layer; and a Schottky gate formation layer consisting of an undoped semiconductor layer formed on said second donor supply layer, wherein said second donor supply layer consists of impurity-doped InP, and said Schottky gate formation layer consists of InAlAs.

3. A transistor according to claim 1, wherein said channel layer comprises an undoped semiconductor layer including at least an InGaAs semiconductor layer.

4. A transistor according to claim 1, wherein said channel layer comprises a stacked structure consisting of at least one undoped semiconductor layer including an InGaAs semiconductor layer.

5. A transistor according to claim 1, wherein said channel layer comprises an undoped semiconductor layer including at least an InGaAsP semiconductor layer.

6. A transistor according to claim 1, wherein said channel layer comprises a stacked structure consisting of at least one undoped semiconductor layer including at least an InGaAsP semiconductor layer.

7. A transistor according to claim 1, further comprising a spacer layer consisting of undoped InP and formed between said channel layer and said donor layer.

8. A transistor according to claim 2, wherein said channel layer comprises an undoped semiconductor layer including at least an InGaAs semiconductor layer.

9. A transistor according to claim 2, wherein said channel layer comprises a stacked structure consisting of at least one undoped semiconductor layer including an InGaAs semiconductor layer.

10. A transistor according to claim 2, wherein said channel layer comprises an undoped semiconductor layer including at least an InGaAsP semiconductor layer.

11. A transistor according to claim 2, wherein said channel layer comprises a stacked structure consisting of at least one undoped semiconductor layer including at least an InGaAsP semiconductor layer.

12. A transistor according to claim 2, further comprising a spacer layer consisting of undoped InP and formed between said channel layer and said donor layer.

* * * * *